United States Patent
Lee

(10) Patent No.: US 9,666,236 B2
(45) Date of Patent: May 30, 2017

(54) MULTI-CHIP PACKAGE

(71) Applicant: SK hynix Inc., Gyeonggi-do (KR)

(72) Inventor: Hyun-Bae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/083,847

(22) Filed: Mar. 29, 2016

(65) Prior Publication Data

US 2017/0103786 A1 Apr. 13, 2017

(30) Foreign Application Priority Data

Oct. 12, 2015 (KR) ........................ 10-2015-0142088

(51) Int. Cl.
| | | |
|---|---|---|
| G11C 5/02 | (2006.01) | |
| H01L 25/065 | (2006.01) | |
| H01L 23/00 | (2006.01) | |
| G11C 14/00 | (2006.01) | |
| G11C 5/14 | (2006.01) | |
| G11C 16/04 | (2006.01) | |

(52) U.S. Cl.
CPC ................ G11C 5/02 (2013.01); G11C 5/147 (2013.01); G11C 14/0063 (2013.01); H01L 24/09 (2013.01); H01L 25/0657 (2013.01); G11C 16/0483 (2013.01); H01L 2224/0912 (2013.01); H01L 2225/0651 (2013.01); H01L 2225/06506 (2013.01)

(58) Field of Classification Search
CPC ....... G11C 5/02; G11C 14/0063; G11C 5/147; H01L 25/0657; H01L 24/09
See application file for complete search history.

(56) References Cited

U.S. PATENT DOCUMENTS

| 6,822,510 | B1 | 11/2004 | Baker | |
|---|---|---|---|---|
| 9,466,555 | B2* | 10/2016 | Lee | ........................ H01L 23/481 |
| 2005/0285683 | A1* | 12/2005 | Drost | .................. H03F 3/45977 330/302 |
| 2007/0035007 | A1* | 2/2007 | Dietz | .................. H01L 25/0657 257/700 |
| 2011/0006794 | A1* | 1/2011 | Sellathamby | ...... G01R 31/3025 324/754.03 |
| 2014/0204490 | A1* | 7/2014 | Mellinger | ........... H01L 27/0255 361/56 |

FOREIGN PATENT DOCUMENTS

KR 1020100041310 4/2010

* cited by examiner

*Primary Examiner* — Toan Le
(74) *Attorney, Agent, or Firm* — IP & T Group LLC

(57) ABSTRACT

A multi-chip package (MCP) includes semiconductor chips integrated therein. Each semiconductor chip includes: pad groups which extend in a first direction and are arranged in a second direction, and each of which includes a first metal line and a second metal line that are stacked in a third direction with an interlayer dielectric layer interposed therebetween; receivers which one-to-one correspond to the respective pad groups, and each of which includes a first input terminal coupled with the first metal line of a corresponding pad group, and an output terminal coupled with the second metal line of the corresponding pad group; and selectors, each of which selects one of a feedback signal transferred from the output terminal of a corresponding receiver and a reference voltage, and provides the selected one to a second input terminal of the corresponding receiver, in response to a chip select signal.

15 Claims, 7 Drawing Sheets

MULTI-CHIP PACKAGE

CROSS-REFERENCE TO RELATED APPLICATION

This application claims priority under 35 U.S.C. §119 to Korean Patent Application No. 10-2015-0142088 filed on Oct. 12, 2015, in the Korean Intellectual Property Office, the disclosure of which is incorporated herein by reference in its entirety.

BACKGROUND

1. Field

Exemplary embodiments of the present invention relate to a semiconductor design technology and, more particularly, to an improved multi-chip package (MCP).

2. Description of the Related Art

Mobile applications require miniaturization of the various employed electronic components. Generally satisfactory miniaturization has been achieved through the development of submicron semiconductor fabrication technologies. However, continuous demand for ever increasing miniaturization has tested the limits of existing submicron technologies resulting in extended development periods and increased manufacturing costs. To address these limitations, a multi-chip package (MCP) technology has been employed, especially for mobile applications. A MCP refers to a composite chip product that allows a plurality of semiconductor chips, such as NOR flash memory chips, NAND flash memory chips, and SRAM chips, to be mounted in a single package. Generally, MCPs have a structure in which two or more semiconductor chips of the same kind are stacked. By employing MCP technology, an internal mounting area can be reduced by at least 50% and a line structure can be simplified, as compared to using a plurality of single-chip packages. Consequently, MCP technology may reduce the production cost, and increase the manufacturing productivity of mobile application devices.

Generally, each of the semiconductor chips mounted in an MCP includes a signal input unit for receiving a signal.

FIG. 1 is a diagram showing a signal input unit 10 provided on each of the semiconductor chips of a conventional MCP.

Referring to FIG. 1, the signal input unit 10 corresponds to a data input/output pad I/O PAD. The signal input unit 10 includes a receiver RX. The receiver RX includes a first (+) input terminal may be coupled with the data input/output pad I/O PAD to receive data DATA inputted through the data input/output pad I/O PAD, a second (−) input terminal receiving a reference voltage VREF, and an output terminal outputting internal data DATA_OUT obtained by amplifying a voltage difference between the data DATA and the reference voltage VREF.

The signal input unit 10 may further include a feedback unit CCOMP to compensate for a loading capacitance of the receiver RX. For reference, the feedback unit CCOMP is formed of a capacitor which is coupled between the output terminal and the first (+) input terminal of the receiver RX. The feedback unit CCOMP forms a positive feedback and provides a negative capacitance to the receiver RX.

However, the separate capacitor forming the feedback unit CCOMP of the signal input 10 may cause increases in the chip size and the input capacitance. Particularly, in an example of an MCP having a plurality of stacked semiconductor chips, the input capacitance may increase in proportion to the number of stacked semiconductor chips, thus negatively impacting the high-speed operation of the MCP.

Therefore, it would be desirable to be able to compensate for the loading capacitance of an MCP without increasing the overall circuit area of the MCP.

SUMMARY

Various embodiments are directed to a multi-chip package (MCP) that may compensate for loading capacitances of a plurality of semiconductor chips integrated therein by differentially configuring the connections of an unselected semiconductor chip and a selected semiconductor chip.

Further, various embodiments are directed to an MCP that may compensate loading capacitances of a plurality of semiconductor chips integrated therein by utilizing metal pads provided in each semiconductor chip, with excluding a separate capacitor.

In an embodiment, a multi-chip package (MCP) may include a plurality of semiconductor chips integrated therein. Each of the semiconductor chips may include: a plurality of pad groups each including a first and a second metal line for pad contact, stacked in a direction with an interlayer dielectric layer interposed therebetween; a plurality of receivers each corresponding to the respective pad groups, and each including a first input terminal coupled with the first metal line of a corresponding pad group, and an output terminal coupled with the second metal line of the corresponding pad group; and a plurality of multiplexers each selecting a reference voltage or a feedback signal transferred from the output terminal of a corresponding receiver, to provide the selected signal to a second input terminal of the corresponding receiver, based on a chip selection signal.

In an embodiment, an MCP may include a plurality of semiconductor chips integrated therein. Each of the semiconductor chips may include: a plurality of pad groups each including a first metal line and a second metal line for pad contact, which are stacked in a direction to form a capacitive element; and a plurality of receivers corresponding to the respective pad groups; wherein, in an unselected semiconductor chip, the first metal line may be coupled with a first input terminal of a corresponding receiver, and the second metal line may be coupled with a second input terminal and an output terminal the corresponding receiver, and wherein, in a selected semiconductor chip, the first metal line may be coupled with a first input terminal of a corresponding receiver, the second metal line may be coupled with an output terminal of the corresponding receiver, and a reference voltage is applied to a second input terminal of the corresponding receiver.

In an embodiment, an MCP may include a plurality of semiconductor chips integrated therein. Each of the semiconductor chips may include: a plurality of layers in which a plurality of pad groups are formed, wherein each of the layers includes a plurality of metal lines for pad contact, and some of the metal lines stacked along a direction form a single pad group; a plurality of receivers each corresponding to the respective pad groups, and each including a first input terminal coupled with an uppermost metal line of corresponding pad group, and an output terminal coupled with a second uppermost metal line of the corresponding pad group; a plurality of multiplexers each selecting a reference voltage or a feedback signal transferred through the output terminal of a corresponding receiver to provide the selected signal to a second input terminal of the corresponding receiver, based on a chip selection signal; and a plurality of switching units each coupling the metal lines formed in odd-numbered layers of a corresponding pad group with each other, and coupling the metal lines formed in even-numbered layers of the corresponding pad group with each other, based on the chip selection signal.

In an embodiment, an MCP may include a plurality of semiconductor chips integrated therein. Each of the semiconductor chips may include: a pad; a receiver including a positive input terminal for receiving a signal inputted through the pad, a negative input terminal, and an output terminal; a first metal line coupled to the pad; and a second metal line coupled to the output terminal, the first and second metal lines overlapped to each other form a negative capacitance to the receiver.

DETAILED DESCRIPTION

Figure 1:
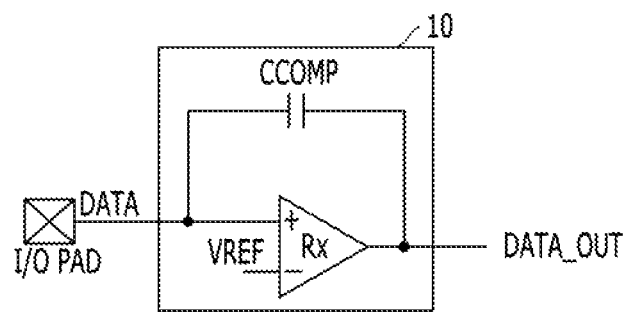
FIG. 1 is a diagram showing a signal input unit provided on each of semiconductor chips of a conventional multi-chip package (MCP).

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or groups thereof.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 2:
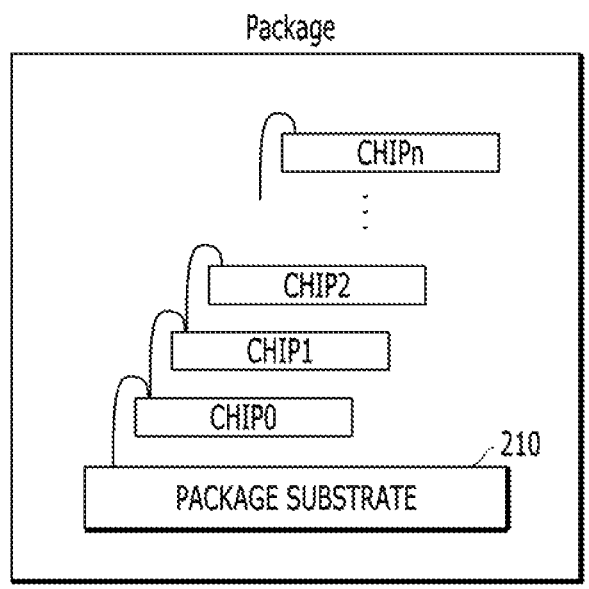
FIG. 2 is a diagram illustrating an MCP, according to an embodiment of the present invention.

FIG. 2 is a diagram illustrating an MCP, according to an embodiment of the present invention.

Referring to FIG. 2, the MCP may include a package substrate 210 and a plurality of semiconductor chips CHIP0, CHIP1, CHIP2, . . . , CHIPn stacked sequentially on the package substrate 210. Each of the semiconductor chips CHIP0, CHIP1, CHIP2, . . . , CHIPn may include a plurality of command input pads and data input/output pads. The command input pads and the data input/output pads may be shared by the semiconductor chips CHIP0, CHIP1, CHIP2, . . . , CHIPn.

In order to select a target semiconductor chip among the plurality of semiconductor chips CHIP0, CHIP1, CHIP2, . . . , CHIPn chip selection signals, such as chip identification (ID) signals or chip enable signals may be inputted from an external controller (not shown). For example, when a chip selection signal corresponding to a target semiconductor chip is activated, the target semiconductor chip may receive a command through the command input pads, perform an operation corresponding to the command, and then input or output data through the data input/output pads, in response to the activated chip selection signal.

Figure 3:
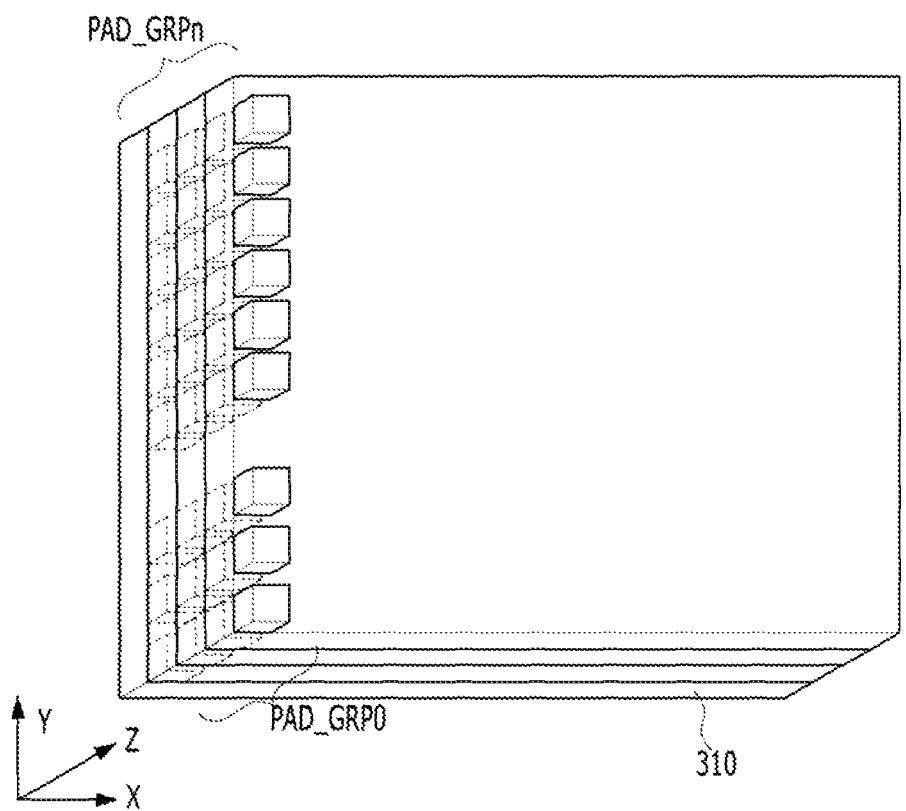
FIG. 3 is a perspective view for describing the respective semiconductor chips shown in FIG. 2.

Referring now to FIG. 3, each of the semiconductor chips among the plurality of semiconductor chips of the MCP of FIG. 2 may include a plurality of pad groups PAD_GRP0, PAD_GRP1, . . . , PAD_GRPn corresponding to input/output data DQ0 to DQn.

Each of the semiconductor chips may include a plurality of layers provided on a silicon substrate 310 with interlayer dielectric layers interposed between the layers. Each of the layers may include a plurality of metal lines for pad contact, which extend in a first direction (i.e., an X-axis direction) and are arranged at regular intervals along a second direction (i.e., a Y-axis direction). (Hereinafter, a metal line for pad contact is referred to as a 'metal line.') A plurality of metal lines of the layers that are stacked along the same line in a third direction (i.e., a Z-axis direction) may form a single pad group. The metal lines of the single pad group may overlap each other. The metal lines included in the same pad group receive the same data.

Since the interlayer dielectric layers are interposed between the metal lines included in the same pad group, a capacitance resulting from a metal/insulating-material/metal structure may be formed between the metal lines included in the same pad group.

According to an embodiment of the present invention, a negative capacitance may be provided to a signal input unit using a capacitance formed between the metal lines included in each pad group even without a separate feedback unit (i.e., CCOMP of FIG. 1). Therefore, despite a reduction in the overall area of the MCP, the loading capacitance of the MCP may be compensated for. Furthermore, the MCP may differentially configure the connections of a selected semiconductor chip and an unselected semiconductor chip among the stacked semiconductor chips. Thereby, the capacitances of the semiconductor chips of the MCP may be compensated for at the same time.

Hereafter, the connections of the respective semiconductor chips included in the MCP according, to an embodiment of the invention will be described with reference to FIGS. 4A to 5C.

Figure 4A:
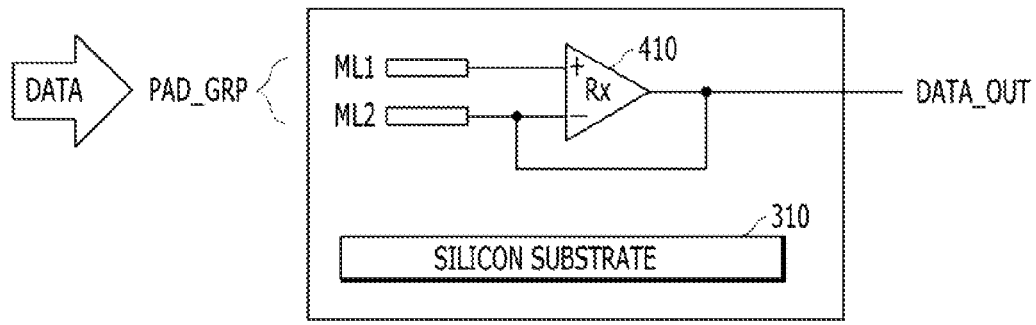
FIGS. 4A to 4C are diagrams illustrating the connections of a signal input unit of an unselected semiconductor chip shown in FIG. 2, according to the number of metal lines in a pad group.
Figure 4B:
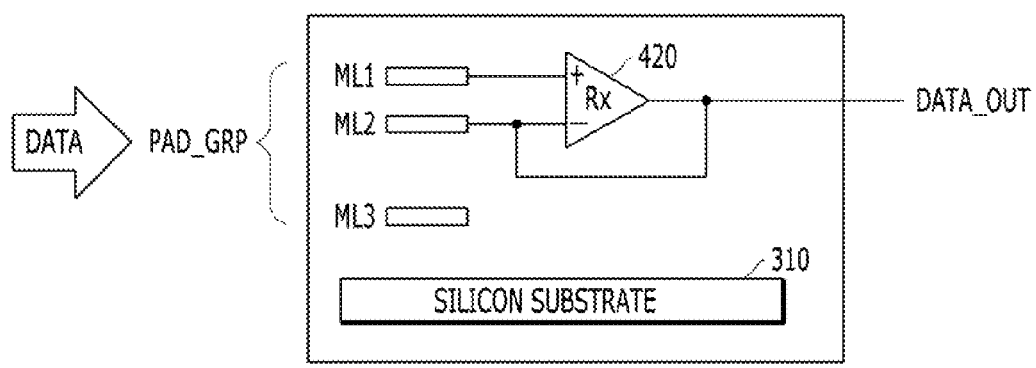
Figure 4C:
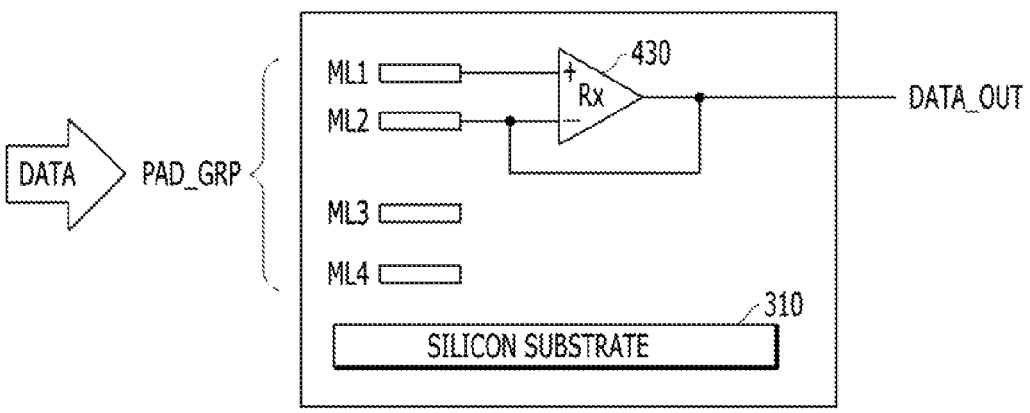

FIGS. 4A to 4C are views for describing the connections of a signal input unit of an unselected semiconductor chip shown in FIG. 2, according to the number of metal lines in a pad group PAD_GRP. FIG. 4A illustrates an example where a single pad group PAD_GRP includes two metal lines ML1 and ML2. FIG. 4B illustrates an example where a single pad group PAD_GRP includes three metal lines ML1, ML2, and ML3. FIG. 4C illustrates an example where a single pad group PAD_GRP includes four metal lines ML1, ML2, ML3, and ML4.

Referring to FIG. 4A, in the case where a single pad group PAD_GRP includes first and second metal lines ML1 and ML2, a signal input unit of an unselected semiconductor chip may include a receiver 410. The receiver 410 may include a unit gain buffer. The first metal line ML1 may be disposed in an uppermost layer of the multiple layers of the semiconductor chip, and the second metal line ML2 may be disposed on a layer below the first metal line ML1.

The first metal line ML1 may be coupled with a positive (±) input terminal of the receiver 410. The second metal line ML2 may be coupled with a negative (−) input terminal and an output terminal of the receiver 410. The receiver 410 may include an operational amplifier (OP-AMP).

With the above-mentioned configuration for the connections, the receiver 410 of the unselected semiconductor chip may compensate for a pad capacitance based on the first metal line ML1, the second metal line ML2 and the unit gain buffer.

Referring to FIGS. 4B and 4C, in the examples where a single pad group PAD_GRP includes additional metal lines, that is, a third metal line ML3 and a fourth metal, line ML4, respectively, the additional metal lines are not separately coupled with a receiver 420 or 430 so that an additional capacitance is not formed. For reference the first metal line ML1 may be disposed in an uppermost layer of the multiple layers of the semiconductor chip. The second metal line ML2 may be disposed in a layer below the first metal line ML1, in other words, in a second uppermost layer. The third metal line ML3 may be disposed in a layer below the second metal line ML2. The fourth metal line ML4 may be disposed in a layer below the third metal line ML3.

Figure 5A:
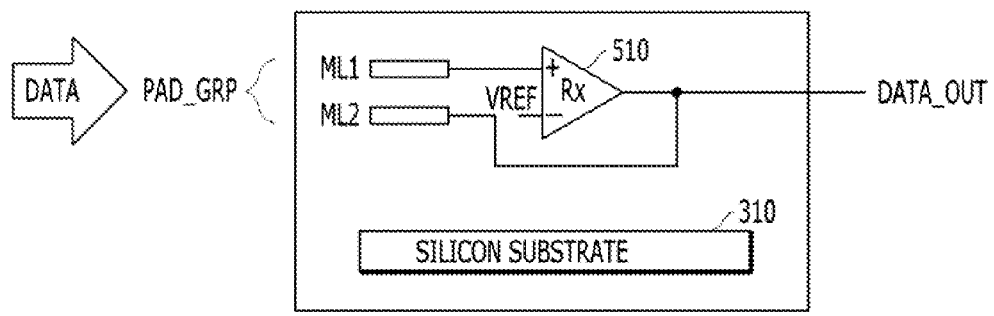
FIGS. 5A to 5C are diagrams illustrating the connections of a signal input unit of a selected semiconductor chip shown in FIG. 2, according to the number of metal lines in a pad group.
Figure 5B:
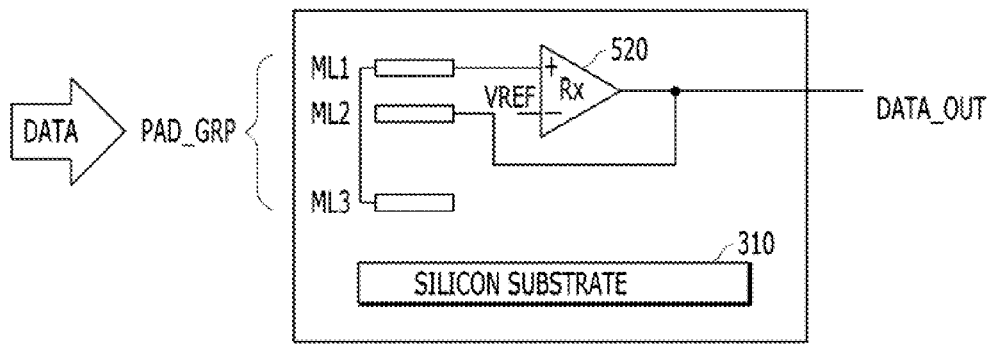
Figure 5C:
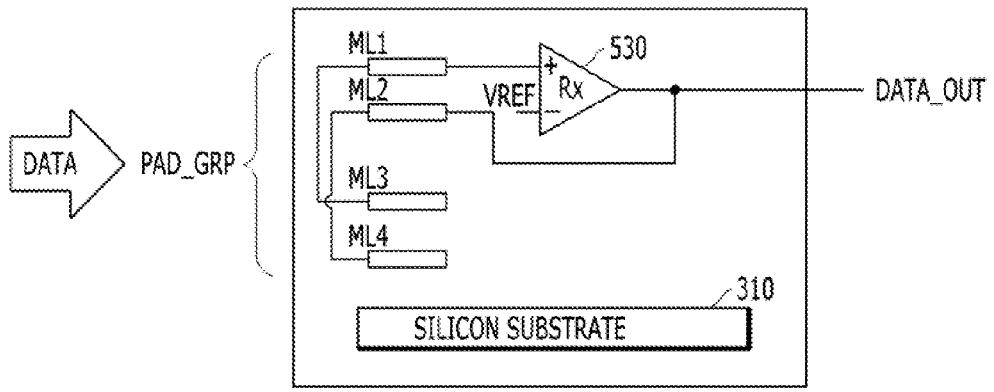

FIGS. 5A to 5C are diagrams illustrating the connections of a signal input unit of a selected semiconductor chip shown in FIG. 2, according to the number of metal lines in a single pad group PAD_GRP. FIG. 5A illustrates an example where a single pad group PAD_GRP includes two metal lines ML1 and ML2. FIG. 5B illustrates an example where a single pad group PAD_GRP includes three metal lines ML1, ML2, and ML3. FIG. 5C illustrates an example where a single pad group PAD_GRP includes four metal lines ML1, ML2 and ML4.

Referring to FIG. 5A, in an example where a single pad group PAD_GRP includes first and second metal lines ML1 and ML2, a signal input unit of the selected semiconductor chip may include a receiver 510 for providing a negative capacitance using first and second metal lines ML1 and ML2. The first metal line ML1 may be disposed in an uppermost layer of the multiple layers of the semiconductor chip, and the second metal line ML2 may be disposed on a layer below the first metal line ML1.

The first metal line ML1 may be coupled with a positive (+) input terminal of the receiver 510. The second metal line ML2 may be coupled with an output terminal of the receiver 510. A reference voltage VREF may be applied to a negative (−) input terminal of the receiver 510. The receiver 510 may include an operational amplifier (OP-AMP).

An interlayer dielectric layer may be formed between first and second metal lines ML1 and ML2. Hence, the first metal line ML1, the interlayer insulating layer, and the second metal line ML2 may form a capacitor. The capacitor may provide a negative capacitance to the receiver 510. Therefore, unlike a conventional technique in which the separate feedback unit (i.e., CCOMP of FIG. 1) provides a negative capacitance to the receiver RX, in the present embodiment of the present invention, a negative capacitance may be provided to the receiver 510 by a plurality of metal pads.

With the above-mentioned configuration for the connections, the receiver 510 of the selected semiconductor chip may compensate for a loading capacitance based on a negative capacitance provided from the first and second metal lines ML1 and ML2.

Referring to FIG. 5B, in an example where a single pad group PAD_GRP includes first to third metal lines ML1 to ML3, a signal input unit of the selected semiconductor chip may include a receiver 520 for providing a negative capacitance using the first to third metal lines ML1 to ML3. The first metal line ML1 may be disposed in an uppermost layer of the multiple layers of the semiconductor chip. The second metal line ML2 may be disposed in a layer below the first metal line ML1, in other words, in a second uppermost layer. The third metal line ML3 may be disposed in a layer below the second metal line ML2.

The connections of the signal input unit of FIG. 5B, other than the fact that the first metal line ML1 may be coupled with the third metal line ML3, may have a configuration similar to the configuration of the first and second metal lines ML1, ML2 and the receiver of FIG. 5A.

Referring to FIG. 5C, in an example where a single pad group PAD_GRP includes first to fourth metal lines ML1 to ML4, a signal input unit of the selected semiconductor chip may include a receiver 530 for providing a negative capacitance using the first to fourth metal lines ML1 to ML4. The first metal line ML1 may be disposed in an uppermost layer of the multiple layers of the semiconductor chip. The second metal line ML2 may be disposed in a layer below the first metal line ML1, in other words, in a second uppermost layer. The third metal line ML3 may be disposed in a layer below the second metal line ML2. The fourth metal line ML4 may be disposed in a layer below the third metal line ML3.

The connections of the signal input unit of FIG. 5C, other than the fact that the first metal line ML1 may be coupled with the third metal line ML3 and the second metal line ML2 may be coupled with the fourth metal line ML4, may have a configuration similar to the configuration of the first and second metal lines ML1 and ML2 and the receiver of FIG. 5A.

As shown in FIGS. 5B and 5C, in respective examples where each of the pad groups includes three or more metal lines, the metal lines formed in odd-numbered layers of each pad group may be coupled with each other, whereas the metal lines formed in even-numbered layers of each pad group may be coupled with each other. Therefore, capacitors coupled in parallel with each other may be formed in each of the odd-numbered and even-numbered layers, whereby a negative capacitance provided to the receiver 520 or 530 may be enhanced. As such, a negative capacitance provided by the capacitors using more than two metal lines may be greater than that provided by using the two metal lines.

Hereafter, the configuration of each of the semiconductor chips provided in an MCP, according to various embodiments of the invention, will be described with reference to FIGS. 6 to 8. Like reference numerals are used throughout FIGS. 6 to 8 to designate the same or similar components.

Figure 6:
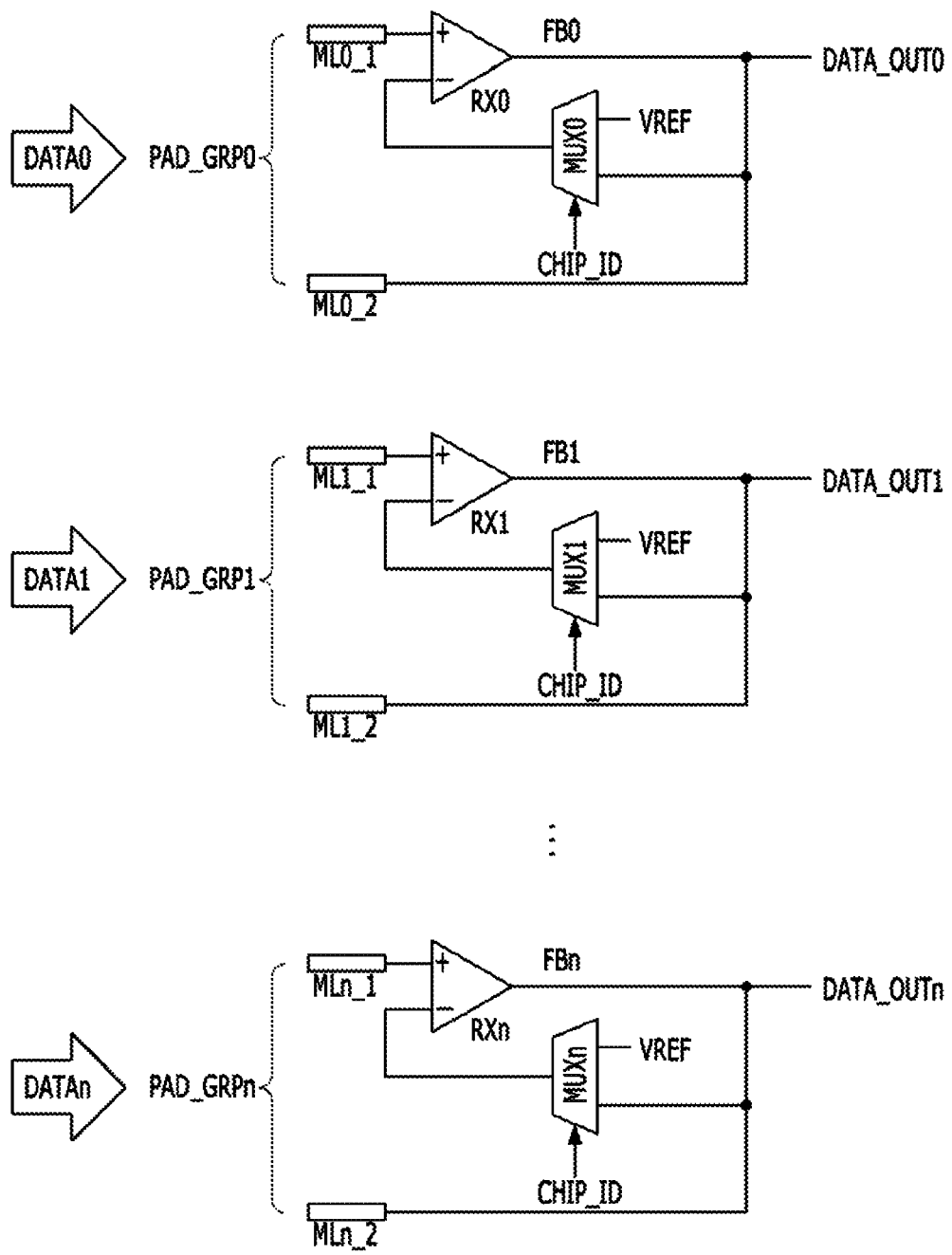
FIG. 6 is a diagram illustrating a semiconductor chip of a plurality of semiconductor chips of an MCP, according to an embodiment of the present invention.

FIG. 6 is a diagram illustrating a semiconductor chip of an MCP, according to an embodiment of the present invention. For reference, FIG. 6 illustrates an example where each of the pad groups PAD_GRP0, PAD_GRP1, . . . , PAD_GRPn includes two metal lines.

Referring to FIG. 6, a semiconductor chip may include a plurality of pad groups PAD_GRP0, PAD_GRP1, . . . , PAD_GRPn corresponding to input data DATA0 to DATA1, . . . , DATAn. Each pad group includes a first metal line ML0_1, ML1_1, . . . , MLn_1 and a second metal line ML0_2, ML1_2, . . . , MLn_2. For reference, each semiconductor chip is formed of a plurality of layers. The first metal line ML0_1, ML1_2, . . . , MLn_1 of each pad group may be disposed in an uppermost layer of the semiconductor chip. The second metal line ML0_2, ML1_2, . . . , MLn_2 of each pad group may be disposed in a layer below the first metal line ML0_1, ML1_1, . . . , MLn_1, in other words, in a second uppermost layer. That is, the first metal line ML0_1, ML1_1, . . . , MLn_1 of each pad group may be placed over the corresponding second metal line ML0_2, ML1_2, . . . , MLn_2.

A semiconductor chip may further include a plurality of receivers RX0, RX1, . . . , RXn and a plurality of multiplexers MUX0, MUX1, . . . , MUXn which respectively one-to-one correspond to the pad groups PAD_GRP0, PAD_GRP1, . . . , PAD_GRPn. Each of receivers RX0, RX1, . . . , RXn has substantially the same configuration, and each multiplexers MUX0, MUX1, . . . , MUXn also has substantially the same configuration. Therefore, the configurations of the first receiver RX0 and the first multiplexer MUX0 will be explained as representative examples.

The first receiver RX0 may include a first input terminal coupled with the first metal line ML0_1 of the first pad group PAD_GRP0, and an output terminal coupled with the second metal line ML0_2 of the first pad group PAD_GRP0. In response to a chip selection signal CHIP_ID, the first multiplexer MUX0 may select one of a feedback signal FB0 transferred from the output terminal of the first receiver RX0 and a reference voltage VREF and provide the feedback signal FB0 to a second input terminal of the first receiver RX0. The first input terminal of the first receiver RX0 may be a positive (+) input terminal. The second input terminal of the first receiver RX0 may be a negative (−) input terminal.

When the chip selection signal CHIP_ID is deactivated, the first multiplexer MUX0 may select the feedback signal FB0 transferred from the output terminal of the first receiver RX0 and provide the feedback signal FB0 to the second input terminal. When the chip selection signal CHIP_ID is activated, the first multiplexer MUX0 may select the reference voltage VREF and provide it to the second input terminal.

When a semiconductor chip is unselected, the chip selection signal CHIP_ID of the corresponding semiconductor chip may be deactivated. Then, the multiplexers MUX0, MUX1, . . . , MUXn may select the feedback signals FB0, FB1, . . . , FBn transferred from the output terminals of the corresponding receivers RX0, RX1, . . . , RXn and provide the feedback signals FB0, FB1, . . . , FBn to the corresponding second input terminals. Therefore, each signal input unit of the unselected semiconductor chip may have the configuration shown in FIG. 4A.

When a semiconductor chip is selected, the chip selection signal CHIP_ID of the corresponding semiconductor chip may be activated. Then, each of the multiplexers MUX0, MUX1, . . . , MUXn may select the reference voltage VREF and provide it to the corresponding second input terminal. Therefore, each signal input unit of the selected semiconductor chip may have the configuration shown in FIG. 5A.

As such, in the MCP having the stacked semiconductor chips according to an embodiment of the present invention, the connections of an unselected semiconductor chip may differ from that of a selected semiconductor chip. Thereby, the capacitances of the semiconductor chips of the MCP may be compensated for at the same time.

Furthermore, a negative capacitance may be provided using the metal pads of each semiconductor chip without using a separate capacitor, which has been used to provide a negative capacitance in the conventional technique. Therefore, despite a reduction in the overall area of the MCP, the loading capacitance of the MCP may be compensated for without an increasing the input capacitance. Consequently, even in a high stack configuration in which the MCP has an increased number of semiconductor chips, high speed operation may be possible.

Figure 7:
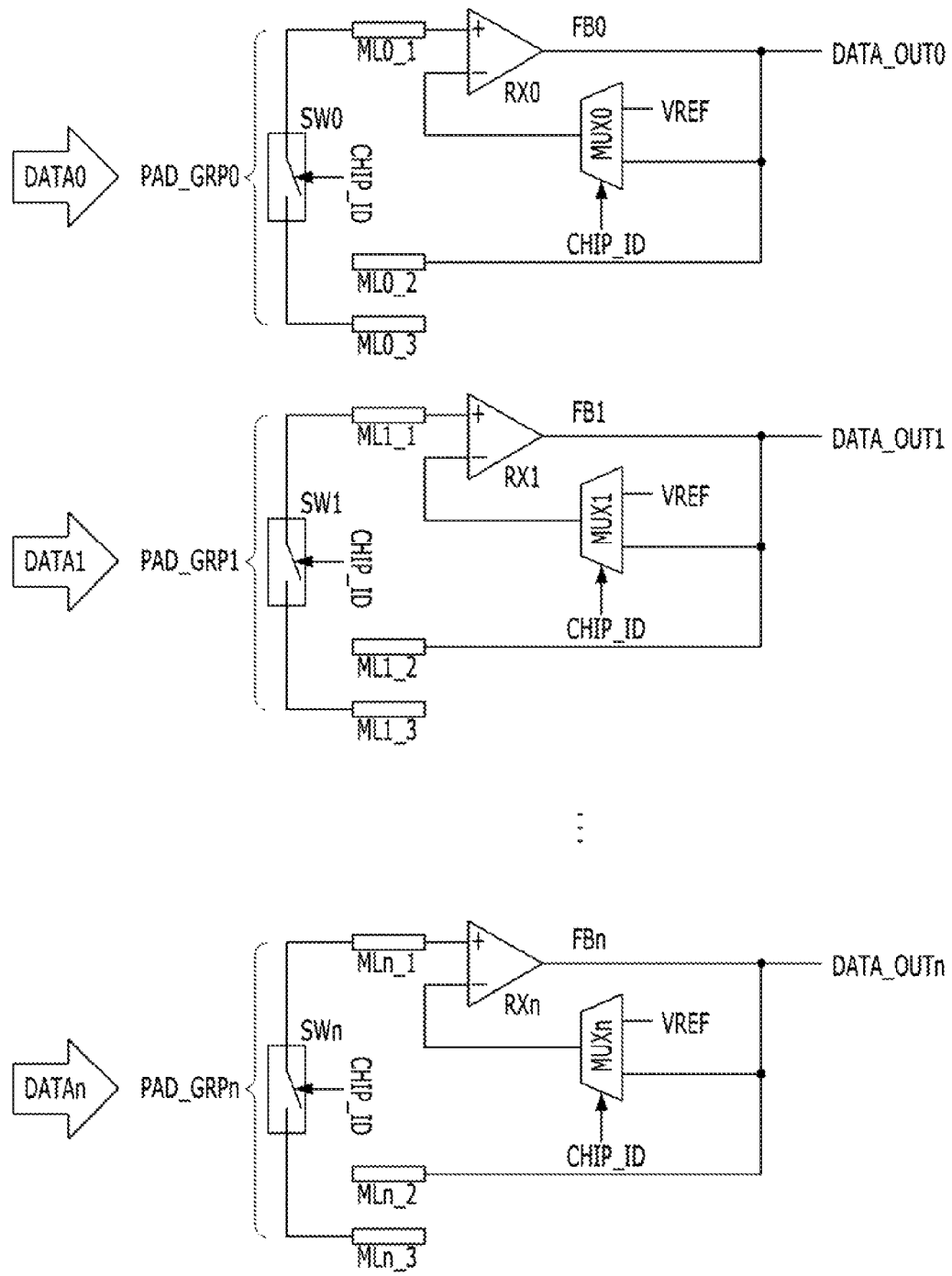
FIG. 7 is a diagram illustrating a semiconductor chip of a plurality of semiconductor chips of an MCP, according to another embodiment of the present invention.

FIG. 7 is a diagram illustrating a semiconductor chip of an MCP, according to another embodiment of the present invention. For reference, FIG. 7 illustrates an example where each of the pad groups PAD_GRP0, PAD_GRP1, . . . , PAD_GRPn includes three metal lines.

Referring to FIG. 7, each of the semiconductor chips may includes a plurality of pad groups PAD_GRP0, PAD_GRP1, . . . , PAD_GRPn corresponding to input data DATA0 to DATA1, . . . , DATAn. Each pad group may include a first metal line ML0_1, ML1_1, . . . , MLn_1, a second metal line ML0_2, ML1_2, . . . , MLn_2, and a third metal line ML0_3, ML1_3, . . . , MLn_3. For reference, the semiconductor chip may be formed of a plurality of layers. The first metal line ML0_1, ML1_1, . . . , MLn_1 of each pad group may be disposed in an uppermost layer of the semiconductor chip. The second metal line ML0_2, ML1_2, . . . , MLn_2 of each pad group may be disposed in a layer below the first metal line ML0_1, ML1_1, . . . , MLn_1, in other words, in a second uppermost layer. The third metal line ML0_3, ML1_3, . . . , MLn_3 of each pad group may be disposed in a layer below the second metal line ML0_2, ML1_2, ..., MLn_2. That is, the first metal line ML0_1, ML1_1, ..., MLn_1 of each pad group may be placed over the corresponding second metal line ML0_2, ML1_2, ..., MLn_2. The second metal line ML0_2, ML1_2, ..., MLn_2 of each pad group may be placed over the corresponding third metal line ML0_3, ML1_3, ..., MLn_3.

Each semiconductor chip further includes a plurality of receivers RX0, RX1, ..., RXn, a plurality of multiplexers MUX0, MUX1, ..., MUXn, and a plurality of switches SW0, SW1, ..., SWn which respectively one-to-one correspond to the pad groups PAD_GRP0, PAD_GRP1, ..., PAD_GRPn. All of the receivers RX0, RX1, ..., RXn, may have substantially the same configuration. Also, all of the multiplexers MUX0, MUX1, ..., MUXn, may have substantially the same configuration. Also, all of the switches SW0, SW1, ..., SWn may have substantially the same configuration. Therefore, only the configurations of the first receiver RX0, the first multiplexer MUX0, and the first switch SW0 will be explained as representative examples. Furthermore, the first receiver RX0 and the first multiplexer MUX0 shown in FIG. 7 have configurations similar to those of the first receiver RX0 and the first multiplexer MUX0 shown in FIG. 6; therefore, detailed description thereof will be omitted.

The first switch SW0 may couple the first metal line ML0_1 and the third metal line ML0_3 with each other in response to a chip selection signal CHIP_ID. In particular, when the chip selection signal CHIP_ID is activated, the first metal line ML0_1 and the third metal line ML0_3 may be coupled with each other.

When a semiconductor chip is unselected, the chip selection signal CHIP_ID of the corresponding semiconductor chip may be deactivated. Then, the multiplexers MUX0, MUX1, ..., MUXn may select the feedback signals FB0, FB1, ..., FBn transferred from the output terminals of the corresponding receivers RX0, RX1, ..., RXn and provide the feedback signals FB0, FB1, ..., FBn to the corresponding second input terminals. Each of the multiple switches SW0, SW1, ..., SWn may not couple the corresponding first metal line ML0_1, ML1_1, ..., MLn_1 and the assigned third metal line ML0_3, ML1_3, ..., MLn_3 with each other. Therefore, each signal input unit of the unselected semiconductor chip may have the configuration shown in FIG. 4B.

When a semiconductor chip is selected, the chip selection signal CHIP_ID of the corresponding semiconductor chip may be activated. Then, each of the multiplexers MUX0, MUX1, ..., MUXn may select the reference voltage VREF and provide it to the corresponding second input terminal. Each of the multiple switches SW0, SW1, ..., SWn may couple the corresponding first metal line ML0_1, ML1_1, ..., MLn_1 and the assigned third metal line ML0_3, ML1_3, ..., MLn_3 with each other. Therefore, each signal input unit of the selected semiconductor chip may have the configuration shown in FIG. 5B.

Figure 8:
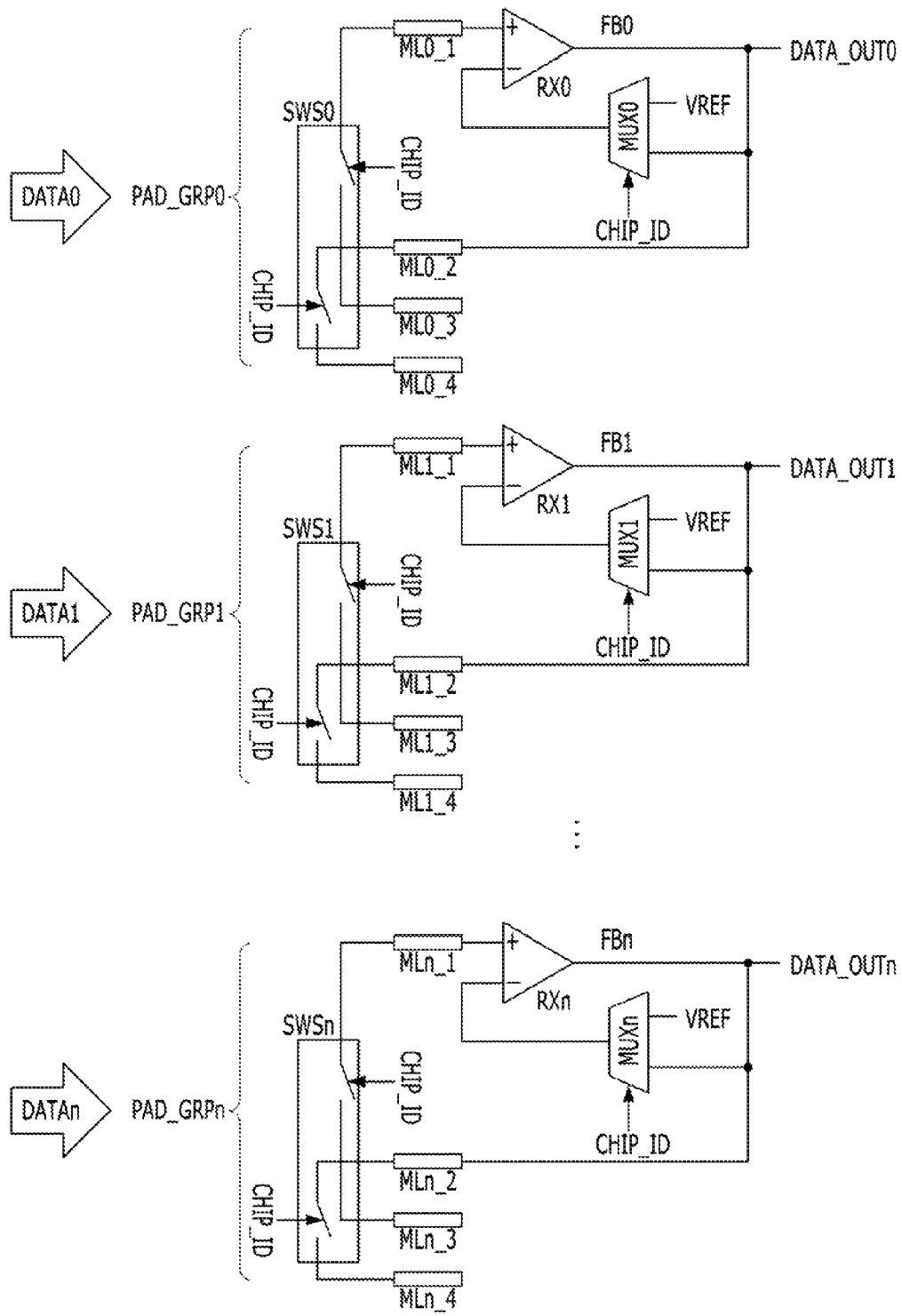
FIG. 8 is a diagram illustrating a semiconductor chip of a plurality of semiconductor chips of an MCP, according to yet another embodiment of the present invention.

FIG. 8 is a diagram illustrating a semiconductor chip of the plurality of semiconductor chips of an MCP according to yet another embodiment of the invention. For reference FIG. 8 illustrates an example where each of the pad groups PAD_GRP0, PAD_GRP1, ..., PAD_GRPn includes four metal lines.

Referring to FIG. 8, the semiconductor chip may include a plurality of pad groups PAD_GRP0, PAD_GRP1, ..., PAD_GRPn corresponding to input data DATA0 to DATA1, ..., DATAn. Each pad group may include a first metal line ML0_1, ML1_1, ..., MLn_1, a second metal line ML0_2, ML1_2, ..., MLn_2, a third metal line ML0_3, ML1_3, ..., MLn_3, and a fourth metal line ML0_4, ML1_4, ..., MLn_4. For reference, the semiconductor chip may be formed of a plurality of layers. The first metal line ML0_1, ML1_1, ..., MLn_1 of each pad group may be disposed in an uppermost layer of the semiconductor chip. The second metal line ML0_2, ML1_2, ..., MLn_2 of each pad group may be disposed in a layer below the first metal line ML0_1, ML1_1, ..., MLn_1, in other words, in a second uppermost layer. The third metal line ML0_3, ML1_3, ..., MLn_3 of each pad group may be disposed in a layer below the second metal line ML0_2, ML1_2, ..., MLn_2. The fourth metal line ML0_4, ML1_4, ..., MLn_4 of each pad group may be disposed in a layer below the third metal line ML0_3, ML1_3, ..., MLn_3. That is, the first metal line ML0_1, ML1_1, ..., MLn_1 of each pad group may be placed over the corresponding second metal line ML0_2, ML1_2, ..., MLn_2. The second metal line ML0_2, ML1_2, ..., MLn_2 of each pad group may be placed over the corresponding third metal line ML0_3, ML1_3, ..., MLn_3. The third metal line ML0_3, ML1_3, ..., MLn_3 of each pad group may be placed over the corresponding fourth metal line ML0_4, ML1_4, ..., MLn_4.

The semiconductor chip further includes a plurality of receivers RX0, RX1, ..., RXn, a plurality of multiplexers MUX0, MUX1, ..., MUXn, and a plurality of switching units SWS0, SWS1, ..., SWSn which respectively one-to-one correspond to the pad groups PAD_GRP0, PAD_GRP1, ..., PAD_GRPn. All of the receivers RX0, RX1, ..., RXn, have substantially the same configuration. Also al of the multiplexers MUX0, MUX1, ..., MUXn, have substantially the same configuration. Al of the switching units SWS0, SWS1, ..., SWSn have substantially the same configuration. Therefore, only the configurations of the first receiver RX0, the first multiplexer MUX0, and the first switching unit. SWS0 will be explained as representative examples. Furthermore, the first receiver RX0 and the first multiplexer MUX0 shown in FIG. 8 have configurations similar to those of the first receiver RX0 and the first multiplexer MUX0 shown in FIG. 6; therefore, detailed description thereof will be omitted.

The first switching unit SWS0 may include a first switch SW0_1 which couples the first metal line ML0_1 and the third metal line ML0_3 with each other in response to a chip selection signal CHIP_ID, and a second switch SW0_2 which couple the second metal line ML0_2 and the fourth metal line ML0_4 with each other in response to the chip selection signal CHIP_ID. In particular, when the chip selection signal CHIP_ID is activated, the first switch SW0_1 may couple the first metal line ML0_1 and the third metal line ML0_3 with each other, and the second switch SW0_2 may couple the second metal line ML0_2 and the fourth metal line ML0_4 with each other. That is, each of the multiple switching units SWS0, SWS1, ..., SWSn may couple the metal lines formed in the odd-numbered layers of the corresponding pad group with each other and couple the metal lines formed in the even-numbered layers of the corresponding pad group with each other.

When a semiconductor chip is unselected, the chip selection signal CHIP_ID of the corresponding semiconductor chip is deactivated. Then, the multiplexers MUX0, MUX1, ..., MUXn may select the feedback signals FB0, FB1, ..., FBn transferred from the output terminals of the corresponding receivers RX0, RX1, ..., RXn and provide the feedback signals FB0, FB1, ..., FBn to the corresponding second input terminals. Each of the multiple switching units SWS0, SWS1, . . . , SWSn may neither couple the metal lines formed in the odd-numbered layers with each other, nor may couple the metal lines formed in the even-numbered layers with each other. Therefore, each signal input unit of the unselected semiconductor chip may have the configuration shown in FIG. 4C.

When a semiconductor chip is selected, the chip selection signal CHIP_ID of the corresponding semiconductor chip is activated. Then each of the multiplexers MUX0, MUX1, . . . , MUXn may select the reference voltage VREF and provide it to the corresponding second input terminal. Each of the multiple switching units SWS0, SWS1, . . . , SWSn may couple the metal lines formed in the odd-numbered layers with each other and couples the metal lines formed in the even-numbered layers with each other. Therefore, each signal input unit of the selected semiconductor chip may have the configuration shown in FIG. 5C.

With regard to the MCP in which multiple semiconductor chips are stacked according to the embodiments, as shown in FIGS. 7 and 8, when each pad group include three or more metal lines, the metal lines that are formed in the odd-numbered layers of each pad group may be coupled with each other, whereas the metal lines that are formed in the even-numbered layers of each pad group may be coupled with each other. Therefore, capacitors coupled in parallel with each other may be formed in each of the odd-numbered and even-numbered layers, whereby a negative capacitance provided to the receiver RX0, RX1, . . . , RXn may be enhanced. As such, a negative capacitance provided by the capacitors using more than two metal lines may be greater than that provided by using the two metal lines.

As described above, according to embodiments of the present invention, an MCP may differentially configure the connections of a selected semiconductor chip and an unselected semiconductor chip among stacked semiconductor chips. Thereby, the capacitances of the semiconductor chips of the MCP may be compensated for at the same time.

Furthermore, the MCP according to embodiments of the invention, may be capable of utilizing metal pads provided in each semiconductor chip without using a separate capacitor. Therefore, despite a reduction in the area of the MCP, a loading capacitance of the MCP may be compensated for without an increase in input capacitance.

Although various embodiments have been described for illustrative purposes, it will be apparent to those skilled in the art that various changes and modifications may be made without departing from the spirit and scope of the invention as defined in the following claims.

What is claimed is:

1. A multi-chip package (MCP) comprising a plurality of semiconductor chips integrated therein,
   wherein each of the semiconductor chips comprises:
   a plurality of pad groups each including a first and a second metal line for pad contact, stacked in a direction with an interlayer dielectric layer interposed therebetween;
   a plurality of receivers each corresponding to the respective pad groups, and each including a first input terminal coupled with the first metal line of a corresponding pad group, and an output terminal coupled with the second metal line of the corresponding pad group; and
   a plurality of multiplexers each selecting a reference voltage or a feedback signal transferred from the output terminal of a corresponding receiver, to provide the selected signal to a second input terminal of the corresponding receiver, based on a chip selection signal.

2. The MCP of claim 1, wherein the first and second metal lines for pad contact extend in a first direction and are arranged at regular intervals along a second direction perpendicular to the first direction.

3. The MCP of claim 1, wherein the first metal line, the second metal line of the respective pad groups, and the interlayer dielectric layer provide a negative capacitance to the corresponding receiver.

4. The MCP of claim 1, wherein each of the multiplexers,
   when the chip selection signal is deactivated, selects the feedback signal to provide the feedback signal to the second input terminal of the receiver, and
   when the chip selection signal is activated, selects the reference voltage to provide the reference voltage to the second input terminal of the receiver.

5. The MCP of claim 1, wherein the first input terminal of the receiver includes a positive input terminal, and the second input terminal of the receiver includes a negative input terminal.

6. A multi-chip package (MCP) comprising a plurality of semiconductor chips integrated therein,
   wherein each of the semiconductor chips comprises: a plurality of pad groups each including a first metal line and a second metal line for pad contact, which are stacked in a direction to form a capacitive element; and a plurality of receivers corresponding to the respective pad groups;
   wherein, in an unselected semiconductor chip, the first metal line may be coupled with a first input terminal of a corresponding receiver, and the second metal line may be coupled with a second input terminal and an output terminal of the corresponding receiver, and
   wherein, in a selected semiconductor chip, the first metal line may be coupled with a first input terminal of a corresponding receiver, the second metal line may be coupled with an output terminal of the corresponding receiver, and a reference voltage is applied to a second input terminal of the corresponding receiver.

7. The MCP of claim 6, wherein the first and second metal lines for pad contact extend in a first direction and are arranged in a second direction perpendicular to the first direction.

8. The MCP of claim 6, wherein the first input terminal of the respective receivers includes a positive input terminal, and the second input terminal of the receiver includes a negative input terminal.

9. A multi-chip package (MCP) comprising a plurality of semiconductor chips integrated therein,
   wherein each of the semiconductor chips comprises:
   a plurality of layers in which a plurality of pad groups are formed, wherein each of the layers includes a plurality of metal lines for pad contact, and some of the metal lines stacked along a direction form a single pad group;
   a plurality of receivers each corresponding to the respective pad groups, and each including a first input terminal coupled with an uppermost metal line of a corresponding pad group, and an output terminal coupled with a second uppermost metal line of the corresponding pad group;
   a plurality of multiplexers each selecting a reference voltage or a feedback signal transferred through the output terminal of a corresponding receiver to provide the selected signal to a second input terminal of the corresponding receiver, based on a chip selection signal; and
   a plurality of switching units each coupling the metal lines formed in odd-numbered layers of a corresponding pad group with each other, and coupling the metal lines formed in even-numbered layers of the corresponding pad group with each other, based on the chip selection signal.

10. The MCP of claim 9, wherein the metal lines for pad contact extend in a first direction and are arranged in a second direction perpendicular to the first direction.

11. The MCP of claim 9, wherein adjacent two metal lines of the respective pad groups, along with an interlayer dielectric layer interposed therebetween, provide a negative capacitance to a corresponding receiver.

12. The MCP of claim 11, wherein each of the multiplexers,
when the chip selection signal is deactivated, selects the feedback signal to provide the feedback signal to the second input terminal of the receiver, and
when the chip selection signal is activated, selects the reference voltage to provide the reference voltage to the second input terminal of the receiver.

13. The MCP of claim 11, wherein, when the chip selection signal is activated, each of the switching units couples the metal lines formed in the odd-numbered layers of a corresponding pad group with each other, and couples the metal lines formed in the even-numbered layers of the corresponding pad group with each other.

14. The MCP of claim 11, wherein the first input terminal of the receiver includes a positive input terminal, and the second input terminal of the receiver includes a negative input terminal.

15. A multi-chip package (MCP) comprising a plurality of semiconductor chips integrated therein,
wherein each of the semiconductor chips comprises:
a pad;
a receiver including a positive input terminal for receiving a signal inputted through the pad, a negative input terminal, and an output terminal;
a first metal line coupled to the pad; and
a second metal line coupled to the output terminal,
the first and second metal lines overlapped to each other form a negative capacitance to the receiver,
wherein, when a corresponding chip selection signal is deactivated, a feedback signal transferred from the output terminal is provided to the negative input terminal, and when the chip selection signal is activated, a reference voltage is provided to the negative input terminal.

* * * * *